(12) United States Patent
Goto et al.

(10) Patent No.: US 6,281,756 B1
(45) Date of Patent: Aug. 28, 2001

(54) TRANSISTOR WITH INTERNAL MATCHING CIRCUIT

(75) Inventors: Seiki Goto; Akira Inoue, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/477,400

(22) Filed: Jan. 4, 2000

(30) Foreign Application Priority Data

Jul. 7, 1999  (JP) .................................................. 11-193062

(51) Int. Cl.[7] ...................................................... H03F 3/191

(52) U.S. Cl. ........................................... 330/302; 330/295

(58) Field of Search .................................... 330/277, 286, 330/295, 302, 307

(56) References Cited

U.S. PATENT DOCUMENTS

| | | | | |
|---|---|---|---|---|
| 4,631,493 | * | 12/1986 | Vendelin et al. ...................... | 330/277 |
| 5,694,085 | * | 12/1997 | Walker ................................. | 330/295 |
| 5,949,287 | * | 9/1999 | Kurusu et al. ....................... | 330/277 |
| 5,955,926 | * | 9/1999 | Uda et al. ............................ | 330/295 |
| 6,137,367 | * | 10/2000 | Ezzedine et al. .................... | 330/311 |

* cited by examiner

*Primary Examiner*—Steven J. Mottola
*Assistant Examiner*—Henry Choe
(74) *Attorney, Agent, or Firm*—Leydig, Voit & Mayer, Ltd.

(57) ABSTRACT

An internally impedance matched transistor circuit prevents low frequency oscillation during high frequency band operation. Field effect transistors and corresponding oscillation-preventing stabilization circuits are located in the same package with the stabilization circuits close to the corresponding field effect transistors. Each oscillation-preventing stabilization circuit includes a resistor and a capacitor connected in series.

6 Claims, 8 Drawing Sheets

TRANSISTOR WITH INTERNAL MATCHING CIRCUIT

BACKGROUND OF THE INVENTION

1. Field of the Invention

The present invention relates to a transistor with an internally impedance matched circuit for use in the microwave band and, more particularly, to such an internal matching transistor incorporated in the same package with a stabilizing circuit for preventing unwanted oscillation.

2. Description of Related Art

High output transistors operable in the microwave band used in satellites and mobile communications stations typically comprise semiconductor components and a matching circuit in the same package. FIG. 8 shows the internal design of such a high output transistor, and FIG. 9 is an equivalent circuit diagram for the high output transistor shown in FIG. 8.

In the high output transistor 100 shown in FIGS. 8 and 9 there are a plurality of semiconductor elements 101, which are field effect transistors. An input impedance matching circuit 102 is disposed toward the microwave signal input side, and an output impedance matching circuit 103 is disposed toward the output side, of each semiconductor element 101.

Bonding wires connect the semiconductor elements 101 to the input impedance matching circuit 102 and output impedance matching circuit 103, the input impedance matching circuit 102 to package lead-throughs 104, and the output impedance matching circuit 103 to package lead-throughs 105.

The matching circuit in this type of internally impedance matched transistor circuit having a semiconductor element inside the same package typically includes striplines connected in series between the inputs and outputs of the semiconductor element and the wire inductance. The matching circuit is therefore usually a low-pass filter type circuit, and it is difficult to achieve a high-pass filter matching circuit. A low-pass filter matching circuit is a high impedance device in the frequency band in which a high frequency transistor is used, and a low impedance device in a low frequency band. Impedance is therefore also low in circuits external to the package at low frequency, the reflection coefficient increases at the reflection plane in a 50Ω system and the stability coefficient is low. The system is therefore susceptible to low frequency oscillation.

Recent development of high output transistors has tended towards further increasing output, thus also increasing device size. As device size increases, input impedance drops and low frequency oscillation problems during high frequency band operation become even greater.

Internal matching circuits and transistors are also typically used with the top of the package sealed by a metal conductor or ceramic cover. This makes it difficult to add a new stabilization circuit internally to the package when anti-oscillation measures adding a stabilization circuit externally to the package are not effective.

It is to be noted that Japanese Patent Laid-open Publication No. 63-86904 teaches an internally impedance matched, high output field-effect transistor in which an anti-oscillation resistor is used between parallel connected transistors to suppress unnecessary oscillation in odd modes.

SUMMARY OF THE INVENTION

With consideration for the above-noted problems, it is an object of the present invention to provide an internally impedance matched transistor circuit for preventing low frequency oscillation during high frequency band operation by disposing an oscillation-preventing stabilization circuit comprising a resistor connected to ground through a capacitor.

To achieve this object, an internally impedance matched transistor circuit according to the present invention comprises, in a single package, a semiconductor element for signal processing a high frequency signal; an input impedance matching unit having an input impedance matching circuit for impedance matching between the semiconductor element and an input terminal to which a high frequency signal is applied from an external source, an output impedance matching unit having an output impedance matching circuit for impedance matching between the semiconductor element and an output terminal from which is output a high frequency signal processed by the semiconductor element, and an oscillation preventing stabilization circuit unit having an oscillation preventing stabilization circuit disposed proximally to the semiconductor element and comprising a resistor and a capacitor.

According to the present invention, the effects of gain drop in the fundamental frequency band can be reduced and a drop in gain in the low frequency band can be achieved, thereby suppressing unnecessary low frequency oscillation. Furthermore, by integrating a circuit for preventing oscillation in the same package, means for oscillation prevention are not necessary externally to the package.

The oscillation preventing stabilization circuit unit is preferably of a circuit design wherein the resistor and capacitor of the oscillation preventing stabilization circuit are connected in series with each other with the capacitor grounded, and the series circuit including the resistor and the capacitor is connected to the input terminal side of the semiconductor element.

Further preferably, a plurality of these semiconductor elements are connected in parallel to each other. In this case, adjacent semiconductor elements can be mutually connected by way of a resistor in the oscillation preventing stabilization circuit. It is therefore possible to suppress odd resonance mode loop oscillation Capacitors of oscillation preventing stabilization circuits for adjacent semiconductor elements are preferably used in common. It is thus possible to reduce the number of capacitors, thereby reduce the number of packaged components, reduce the required packaging space inside the package, and thus reduce cost.

When a plurality of semiconductor elements are used, input and output terminals of adjacent semiconductor elements are further preferably used in common. In this case the same effects can be achieved when the output from two FETs (field-effect transistors) are passed as a composite output signal.

The capacitor of the oscillation preventing stabilization circuit is yet further preferably a surface oxidation type MOS capacitor. In this case an extremely thin dielectric can be achieved while required strength can be assured with the thickness of the underlying semiconductor layer. A low cost, high capacitance capacitor can thus be achieved in a small area, and cost can be reduced.

Further preferably, the capacitor and resistor of the oscillation preventing stabilization circuit are formed with the input impedance matching unit on a MOS substrate. It is thus possible to reduce the number of packaged components, reduce the required packaging space inside the package, and thus reduce packaging cost.

Other objects and attainments together with a fuller understanding of the invention will become apparent and appreciated by referring to the following description and claims taken in conjunction with the accompanying drawings.

DESCRIPTION OF THE PREFERRED EMBODIMENTS

The preferred embodiments of the present invention are described below with reference to the accompanying figures.

Embodiment 1

Figure 1:
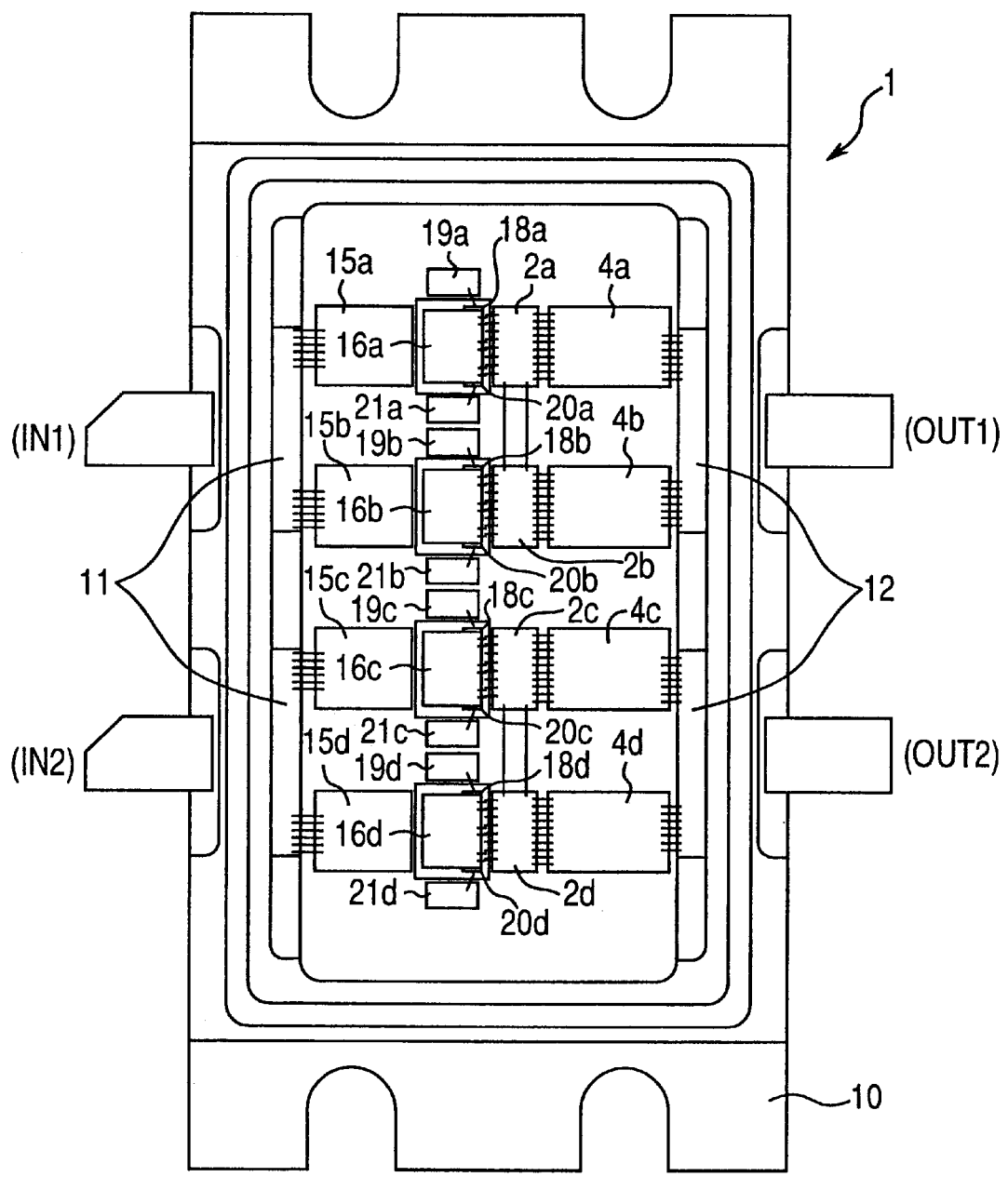
FIG. 1 shows an exemplary internal design of an internally impedance matched transistor circuit according to a first preferred embodiment of the present invention.
Figure 2:
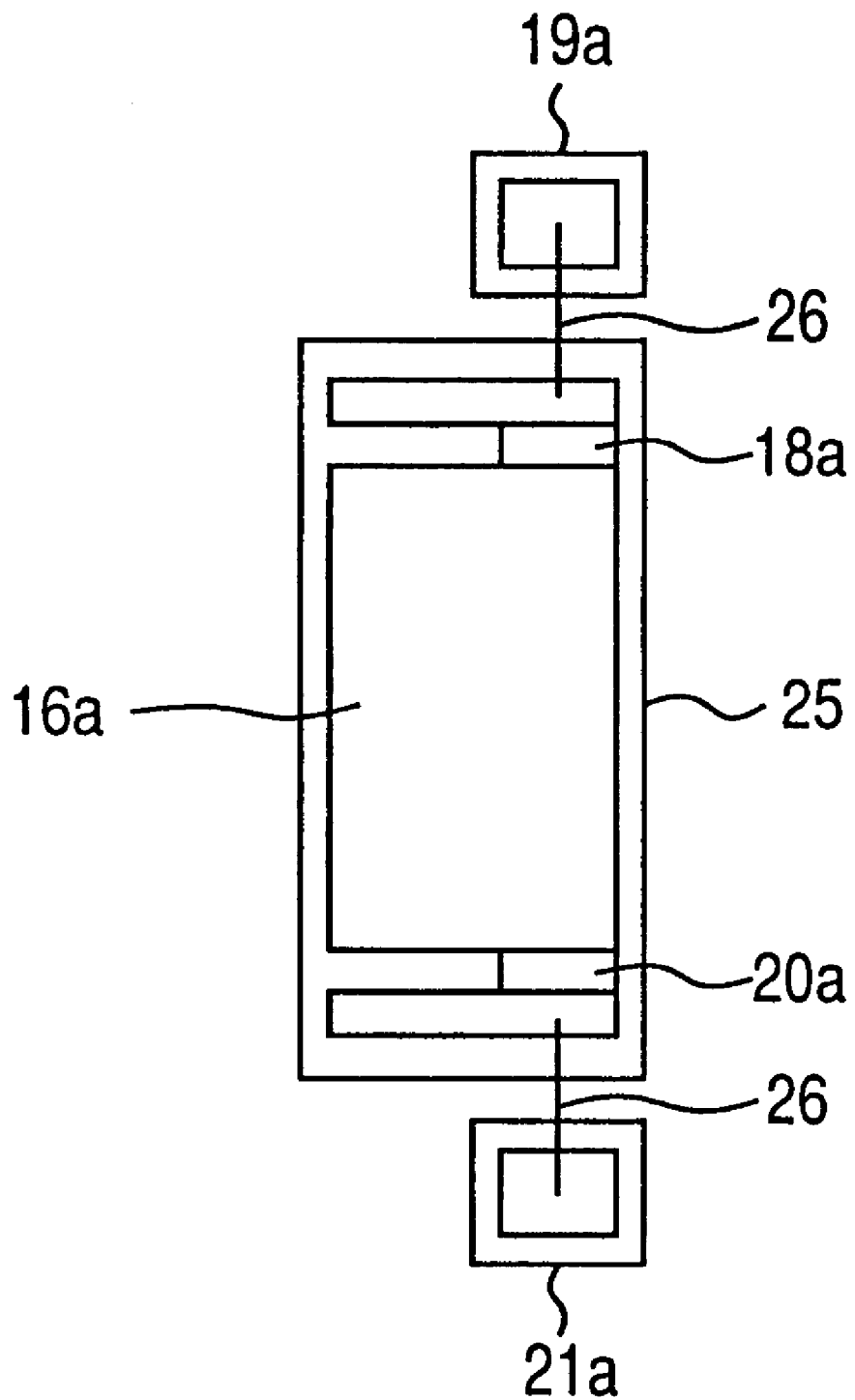
FIG. 2 is a detailed view of a part of the internally impedance matched transistor circuit transistor shown in FIG. 1.
Figure 3:
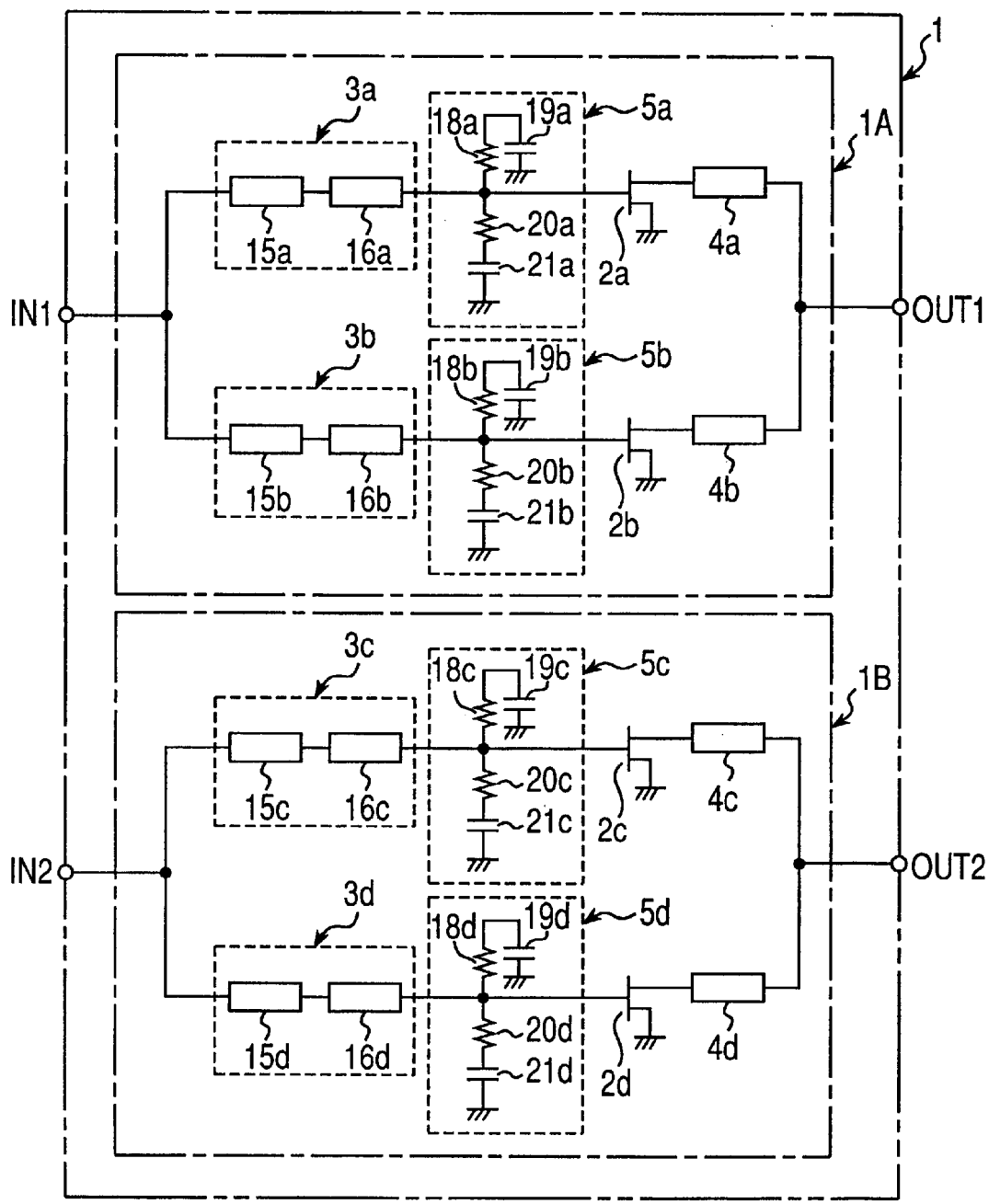
FIG. 3 is an equivalent circuit diagram of the internally impedance matched transistor circuit shown in FIG. 1.

An internally impedance matched transistor circuit 1 according to a first preferred embodiment of the present invention is described below with reference to FIG. 1 to FIG. 5. FIG. 1 to FIG. 3 show an internally impedance matched transistor circuit 1 comprising four semiconductor elements with FIG. 3 showing an exemplary embodiment in which the semiconductor elements are field-effect transistors (FET). FIG. 2 is an enlarged view of the area around microstrip line 16a in FIG. 1. It is to be noted that microstrip lines 16b to 16d are identical to microstrip line 16a, and are therefore omitted in FIG. 2.

In FIG. 1 to FIG. 3 the internally impedance matched transistor circuit 1 includes two pairs of internally impedance matched transistor circuit units 1A and 1B in a single package. Internally matched transistor circuit units 1A comprise semiconductor elements such as FETs 2a and 2b, input impedance matching circuits 3a and 3b, output impedance matching circuits 4a and 4b, and oscillation-preventing stabilization circuits 5a and 5b. The other internally impedance matched transistor circuit units 1B likewise comprise semiconductor elements such as FETs 2c and 2d, input impedance matching circuits 3c and 3d, output impedance matching circuits 4c and 4d, and oscillation-preventing stabilization circuits 5c and 5d. It is to be further noted that FETs 2a to 2d are shown as FET chips in FIG. 1.

The FETs 2a to 2d are parallel on the package base 10, which is typically a CMC (copper-metal-copper) structure including three layers of copper-tungsten alloy or copper, molybdenum and copper, for example. The input impedance matching circuits 3a to 3d, output impedance matching circuits 4a to 4d, and oscillation-preventing stabilization circuits 5a to 5d are also located on the package base 10.

The input impedance matching circuits 3a to 3d are disposed toward the microwave signal input side of the corresponding FETs 2a to 2d, the output impedance matching circuits 4a to 4d are disposed toward the corresponding output side, and the oscillation-preventing stabilization circuits 5a to 5d are located near the FETs 2a to 2d. The FETs 2a to 2d and corresponding input impedance matching circuits 3a to 3d, the FETs 2a to 2d and corresponding output impedance matching circuits 4a to 4d, the input impedance matching circuits 3a to 3d and package lead-throughs 11, and the output impedance matching circuits 4a to 4d and package lead-throughs 12, are respectively connected by bonding wires.

The input impedance matching circuits 3a to 3d are formed by corresponding microstrip lines 15a to 15d and 16a to 16d. A high frequency signal supplied from input terminal IN1 is applied through microstrip lines 15a and 16a to the gate of FET 2a, and through microstrip lines 15b and 16b to the gate of FET 2b. A high frequency signal supplied from input terminal IN2 is likewise applied through microstrip lines 15c and 16c to the gate of FET 2c, and through microstrip lines 15d and 16d to the gate of FET 2d.

The high frequency signals processed by FETs 2a and 2b are respectively passed through output impedance matching circuits 4a and 4b, which are microstrip lines, and output from output terminal OUT1. The high frequency signals processed by FETs 2c and 2d are likewise respectively passed through output impedance matching circuits 4c and 4d, which are also microstrip lines, and output from output terminal OUT2.

The oscillation-preventing stabilization circuits 5a to 5d are for preventing unnecessary oscillation in the corresponding FETs 2a to 2d. The oscillation-preventing stabilization circuits 5a to 5d comprise, respectively, resistors 18a to 18d and 20a to 20d, and capacitors 19a to 19d and 21a to 21d.

Stabilization circuit 5a comprises resistor 18a and capacitor 19a connected in series between ground and the gate of FET 2a, and resistor 20a and capacitor 21a also connected in series between ground and the gate of FET 2a. That is, the resistors 18a and 20a connected to the gate of FET 2a are grounded through the corresponding capacitors 19a and 21a. The resistors 18a and 20a are also located on the input-side matching circuit layer 25 on which microstrip line 16a is formed, and are connected to the corresponding capacitor (or capacitor chip) by a bonding wire 26.

Stabilization circuits 5b to 5d likewise comprise resistors 18b to 18d and capacitors 19b to 19d connected in series between ground and the gate of FETs 2b to 2d, and resistors 20b to 20d and capacitors 21b to 21d connected in series between ground and the gate of FETs 2b to 2d. That is, the resistors 18b and 20b connected to the gate of FET 2b are grounded through the corresponding capacitors 19b and 21b; the resistors 18c and 20c connected to the gate of FET 2c are grounded through the corresponding capacitors 19c and 21c; and the resistors 18d and 20d connected to the gate of FET 2d are grounded through the corresponding capacitors 19d and 21d.

Resistors 18b and 20b are likewise located on the input-side matching circuit substrate (not shown) on which microstrip line 16b is located, and are connected to the corresponding capacitor (or capacitor chip) by bonding wires; resistors 18c and 20c are located on the input-side matching circuit substrate (not shown) on which microstrip line 16c is located, and are connected to the corresponding capacitor (or capacitor chip) by bonding wires; and resistors 18d and 20d are located on the input-side matching circuit substrate (not shown) on which microstrip line 16d is formed, and are connected to the corresponding capacitor (or capacitor chip) by bonding wires.

In this structure, the pair of internally impedance matched transistor circuit units 1A are so designed as to output through the output terminal OUT1 a composite output of the FETs 2a and 2b relative to the high frequency signal inputted to the input terminal IN1 is whereas the internally impedance matched transistor circuit 1B is so designed as to output through the output terminal OUT2 a composite output of the FETs 2c and 2d relative to the high frequency signal inputted to the input terminal IN2.

Figure 4:
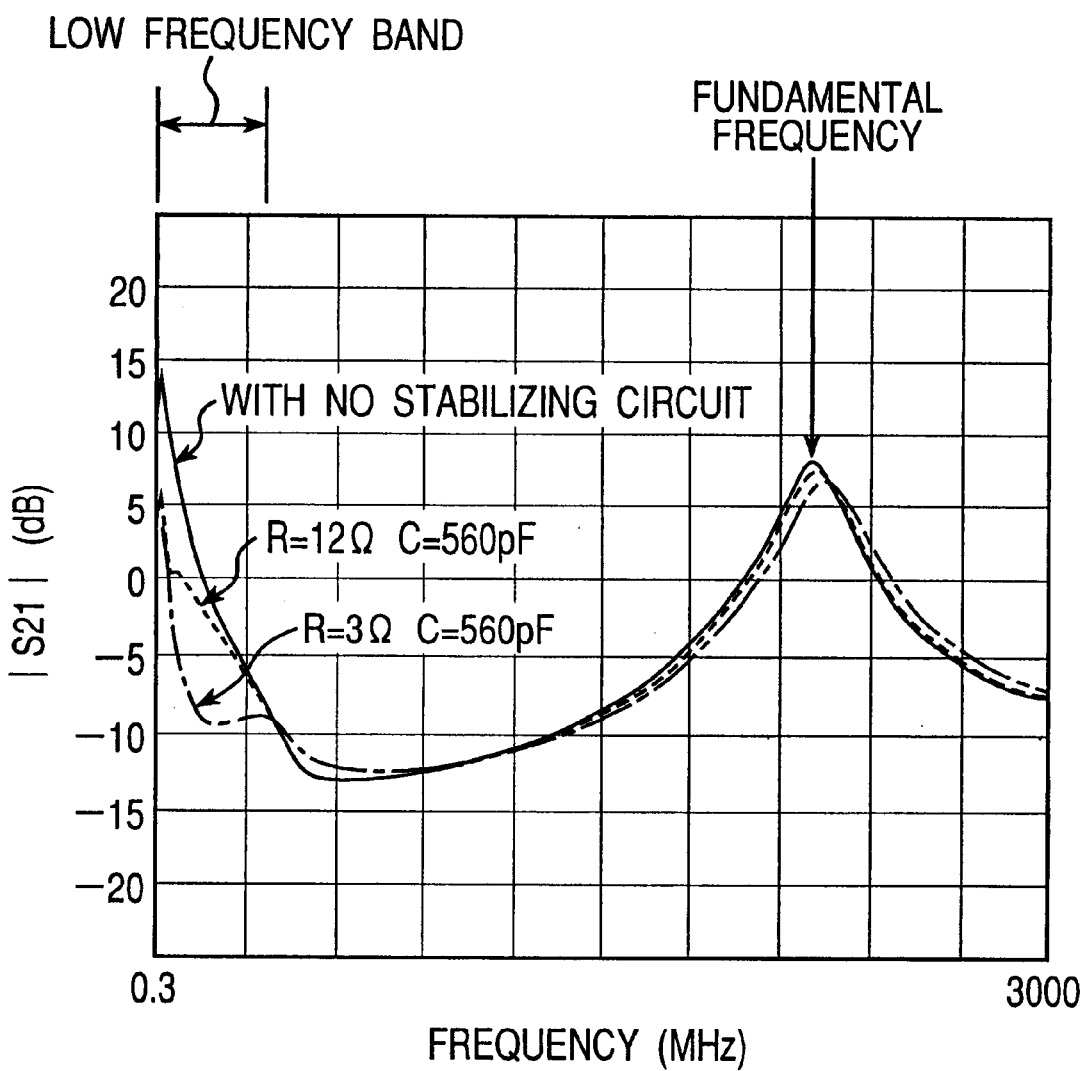
FIG. 4 is a graph of the S parameter characteristic of a field effect transistor shown in FIG. 1 to FIG. 3.

FIG. 4 is a graph of the S parameter characteristic of FET 2a in the internal matching transistor 1 shown in FIG. 1 to FIG. 3. The S parameter of FET 2a shown therein is measured by changing R with resistor 20a connected to a capacitor where R is the resistance of the resistor 18a and C is the capacitance of the capacitor 19a in stabilization circuit 5a.

It is known from FIG. 4 that when the oscillation preventing stabilization circuit is integrated into the package, the S parameter $|S_{21}|$ drops only in the low frequency band when compared with a device without an integrated oscillation preventing stabilization circuit. In addition, the S parameter $|S_{21}|$ in the low frequency band also drops as resistance R becomes lower. It should be further noted that the curve shown in FIG. 4 was obtained with a stabilization circuit 5a comprising resistor 18a and capacitor 19a, but the same result is obtained with a stabilization circuit 5a comprising resistor 18a and capacitor 19a connected in series, and resistor 20a and capacitor 21a connected in series.

It should be further noted that the composite capacitance C of the capacitors 19a to 19d and 21a to 21d in the stabilization circuits 5a to 5d must be high enough to short circuit low frequency signal in order to achieve a stabilization circuit that can effectively prevent low frequency oscillation. With normal parallel plate capacitors, however, device strength drops when the dielectric thickness is decreased to increase capacitance. This causes practical packaging problems. This can be resolved, however, by using a surface oxidation type MOS capacitor, referred to below as simply an MOS capacitor.

In the MOS capacitor the dielectric is the surface oxidation film. It is therefore possible to have an extremely thin dielectric while using the thickness of the lower semiconductor layer to assure sufficient strength. A high capacitance capacitor can therefore be achieved in a small area. The MOS capacitor can also be very inexpensively produced, making it additionally possible to achieve a significant cost reduction.

Figure 5:
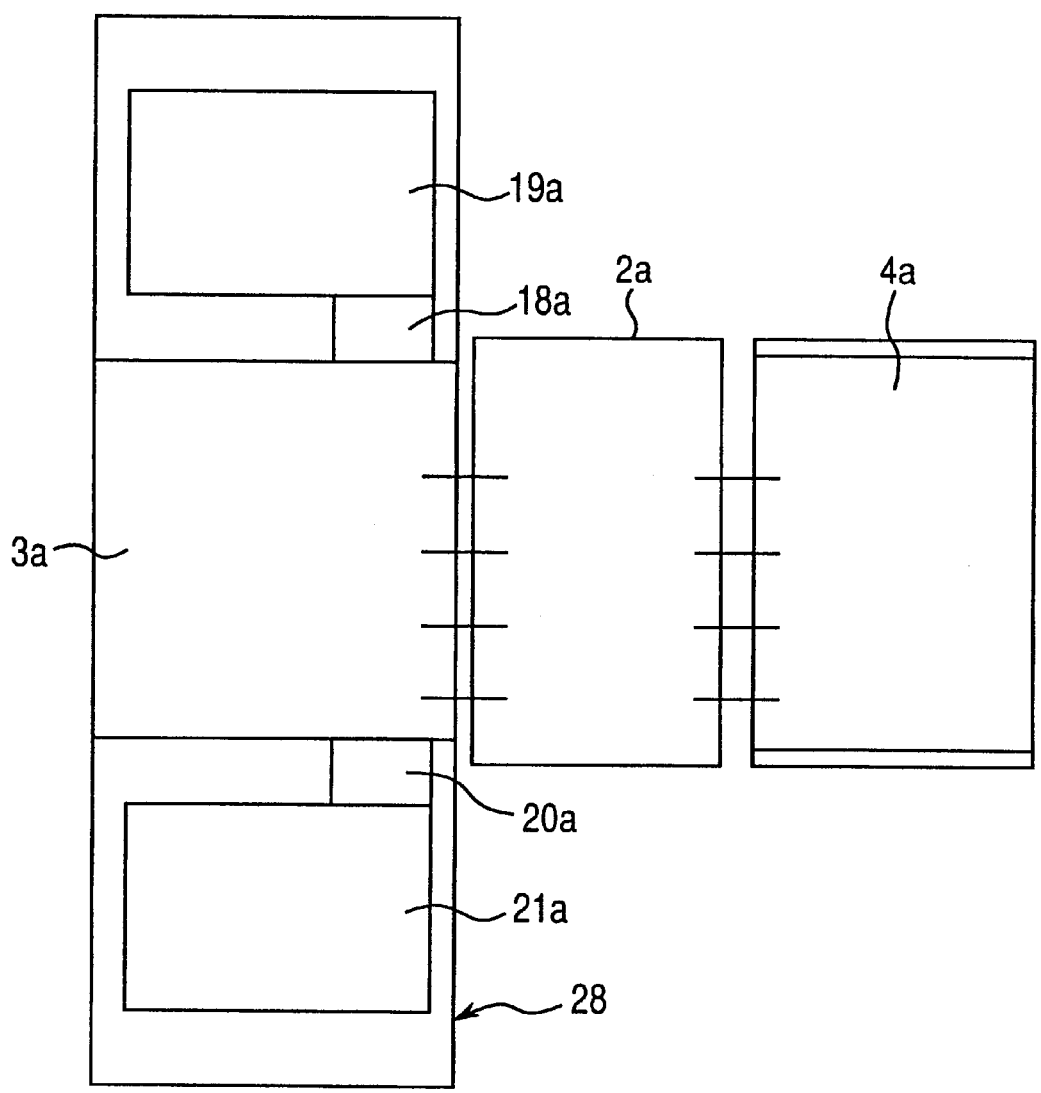
FIG. 5 shows an alternative internal design for the internally impedance matched transistor circuit shown in FIG. 1.

It is also possible to achieve a one-chip device by using an MOS type substrate for the input side matching circuit layer, and integrating the oscillation preventing stabilization circuit and input impedance matching circuit on an MOS substrate 28 as shown in FIG. 5. It is thus possible to reduce the number of parts, thereby reduce the required packaging space, and thus reduce the packaging cost.

In the internally impedance matched transistor circuit according to this first preferred embodiment of the present invention, the oscillation-preventing stabilization circuits 5a to 5d are located near the corresponding FETs 2a to 2d in the same package because impedance at the low frequency band is close to impedance at the fundamental frequency band in areas near the semiconductor element. It is therefore possible to reduce the effects of gain drop in the fundamental frequency band and reduce gain in the low frequency band to suppress low frequency oscillation.

It is also not necessary to take oscillation preventing measures external to the package with an internal matching transistor according to the present invention because a circuit for preventing such oscillation can be integrated into the same package.

Embodiment 2

The oscillation-preventing stabilization circuits 5a to 5d in the above first preferred embodiment of the present invention can also serve as isolation resistors between two adjacent semiconductor elements as described below according to this second embodiment of the invention.

Figure 6:
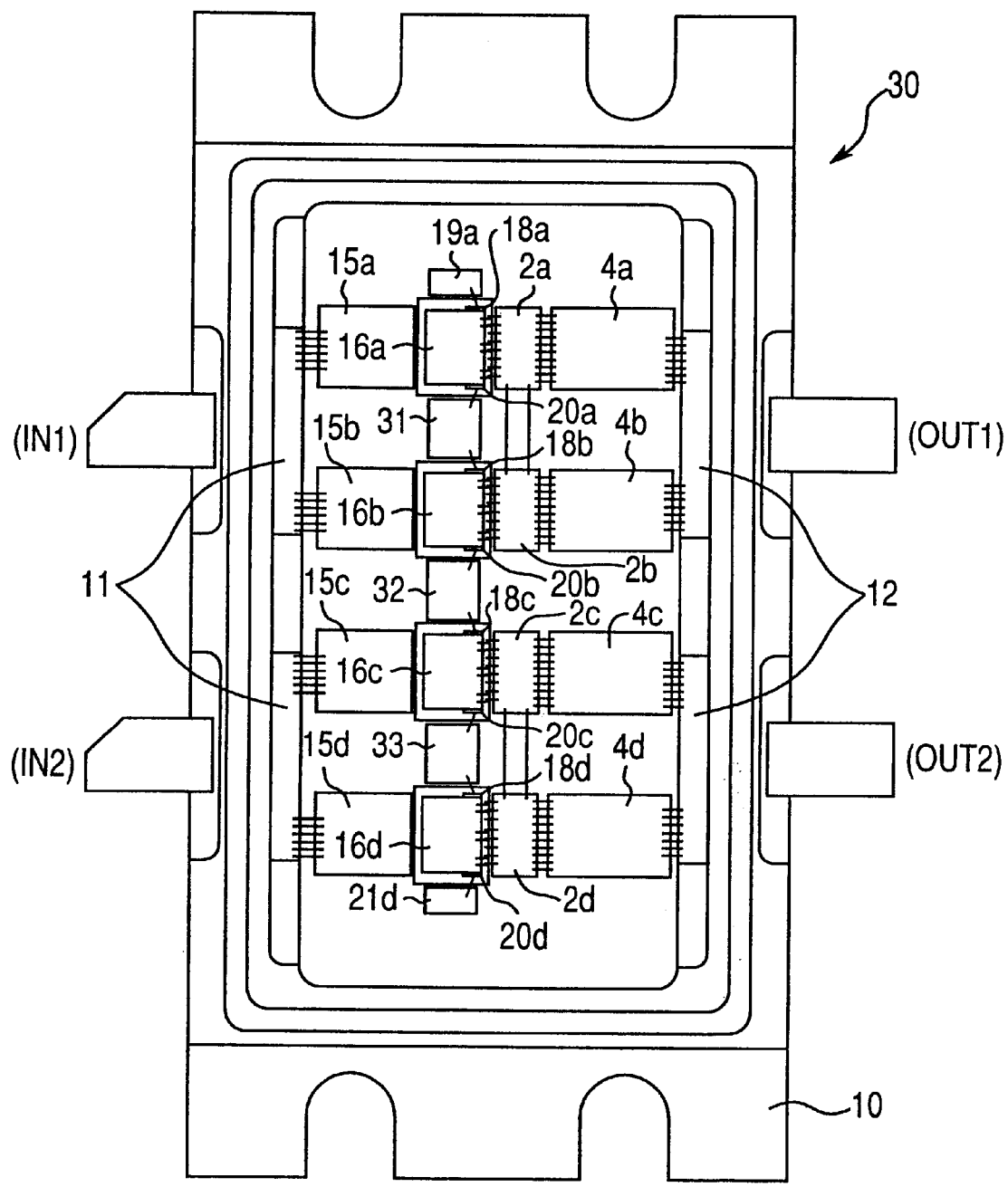
FIG. 6 shows an exemplary internal design of an internally impedance matched transistor circuit according to a second preferred embodiment of the present invention.
Figure 7:
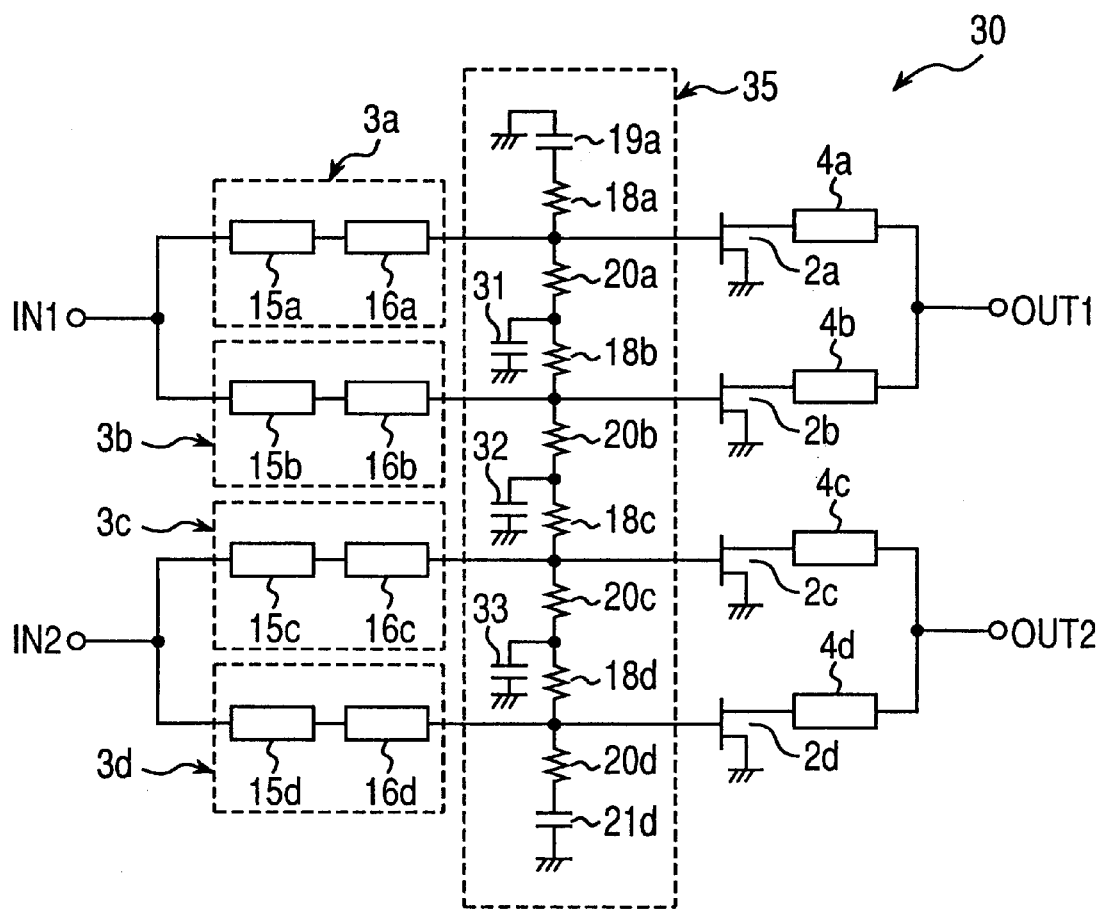
FIG. 7 is an equivalent circuit diagram of the internally impedance matched transistor circuit shown in FIG. 6.
Figure 8:
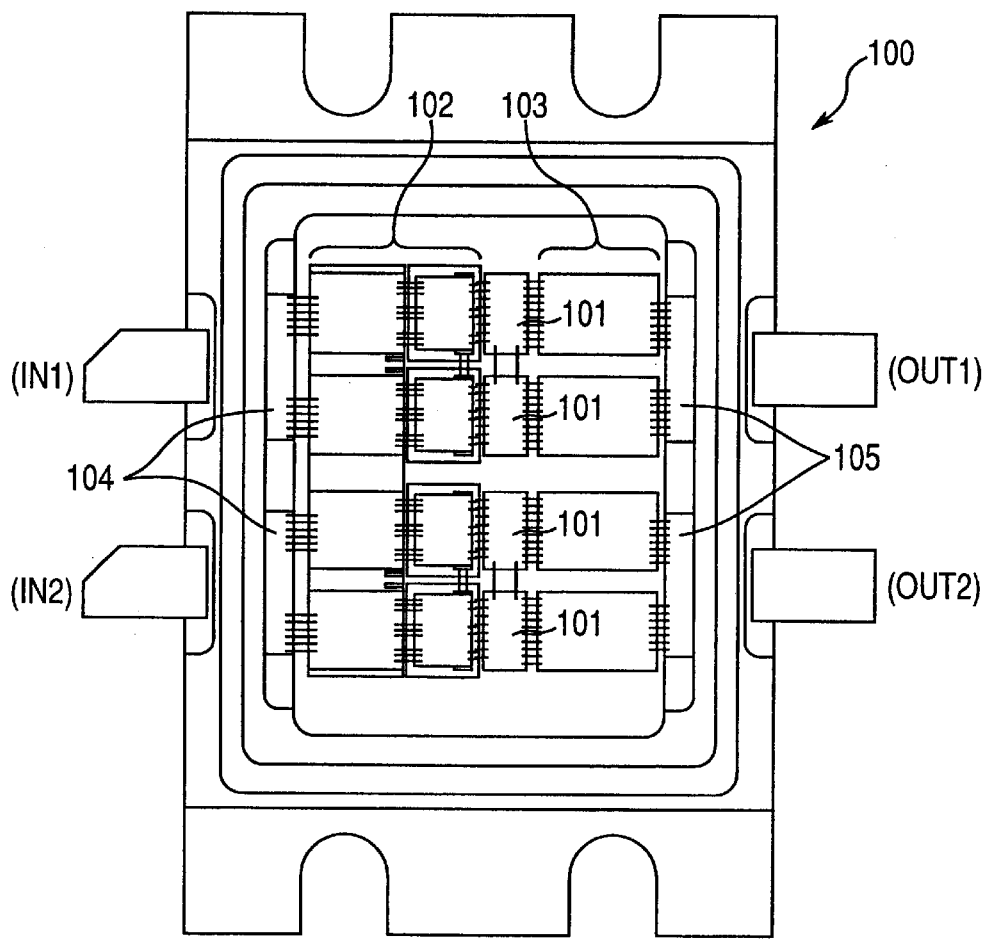
FIG. 8 shows the internal design of a typical high output transistor according to the related art.
Figure 9:
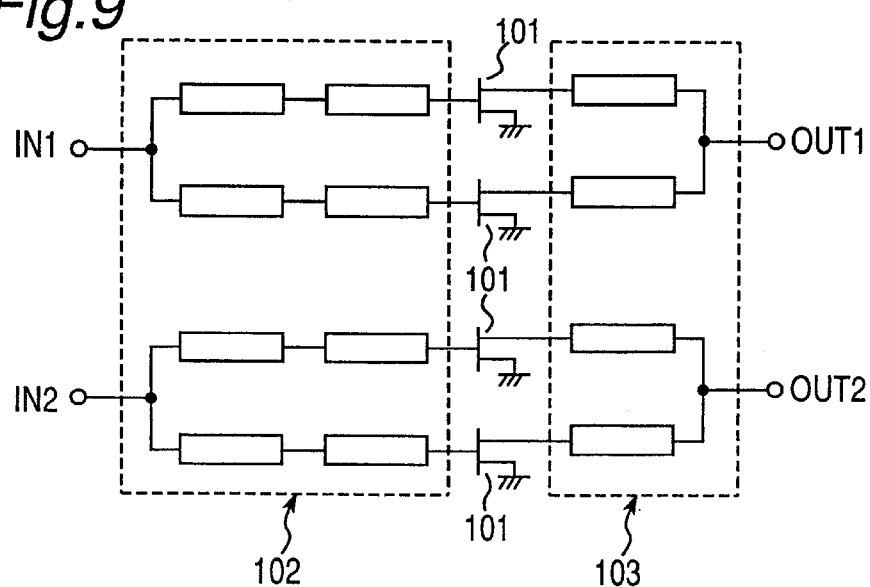
FIG. 9 is an equivalent circuit diagram of the high output transistor shown in FIG. 8.

FIG. 6 and FIG. 7 show an internally impedance matched transistor circuit 1 comprising four semiconductor elements with FIG. 7 showing an exemplary embodiment in which the semiconductor elements are a field-effect transistors (FET). It is to be further noted that like parts are identified by like reference numerals in FIG. 1 to FIG. 3 and FIGS. 6 and 7. Further description thereof is thus omitted below where only the differences between the present embodiment and that shown in FIG. 1 to FIG. 3 are shown.

The differences between the devices shown in FIGS. 6 and 7 and FIGS. 1 to 3 are that capacitors 21a and 19b are replaced by a single capacitor 31, capacitors 21b and 19c are replaced by a single capacitor 32, and capacitors 21c and 19d are replaced by a single capacitor 33; and resistor 20a is connected to resistor 18a, resistor 20b to resistor 18c, and resistor 20c to resistor 18d. The oscillation-preventing stabilization circuits 5a to 5d shown in FIG. 3 are therefore referenced as oscillation-preventing stabilization circuit 35, and internally impedance matched transistor circuit 1 shown in FIG. 1 and FIG. 3 are referenced as internally impedance matched transistor circuit 30. internal matching transistor 30.

In FIG. 6 and FIG. 7 the internally impedance matched transistor circuit 30 comprises FETs 2a to 2d, input impedance matching circuits 3a to 3d, output impedance matching circuits 4a to 4d, and oscillation-preventing stabilization circuit 35. Input impedance matching circuits 3a to 3d and stabilization circuit 35 are formed on the input-side matching circuit substrate (not shown in the figure) on the package base 10. It is to be noted that FETs 2a to 2d in FIG. 6 are shown as FET chips.

The oscillation-preventing stabilization circuit 35 is for preventing unnecessary oscillation in the corresponding FETs 2a to 2d. It comprises resistors 18a to 18d and 20a to 20d, and capacitors 19, 21d, and 31 to 33. Resistor 18a and capacitor 19a are connected in series between ground and the gate of FET 2a, and resistor 20a and capacitor 31 are also connected in series between ground and the gate of FET 2a. That is, the resistors 18a and 20a connected to the gate of FET 2a are grounded through the corresponding capacitors 19a and 31.

Resistor 18b and capacitor 31 are connected in series between ground and the gate of FET 2b, and resistor 20b and capacitor 32 are also connected in series between ground and the gate of FET 2b. That is, the resistors 18b and 20b connected to the gate of FET 2b are grounded through the corresponding capacitors 31 and 32, and the node between resistor 20a and capacitor 31 is connected through resistor 18b to the gate of FET 2b.

Resistor 18c and capacitor 32 are connected in series between ground and the gate of FET 2c, and resistor 20c and capacitor 33 are also connected in series between ground and the gate of FET 2c. That is, the resistors 18c and 20c connected to the gate of FET 2c are grounded through the corresponding capacitors 32 and 33, and the node between resistor 20b and capacitor 32 is connected through resistor 18c to the gate of FET 2c.

Resistor 18d and capacitor 33 are connected in series between ground and the gate of FET 2d, and resistor 20d and capacitor 21d are also connected in series between ground and the gate of FET 2d. That is, the resistors 18d and 20d connected to the gate of FET 2d are grounded through the corresponding capacitors 33 and 21d, and the node between resistor 20c and capacitor 33 is connected through resistor 18d to the gate of FET 2d.

In this exemplary embodiment of the present invention FETs 2a and 2b, input impedance matching circuits 3a and 3b, output impedance matching circuits 4a and 4b, resistors 18a, 18b, 20a, 20b, and capacitors 19a, 31, and 32 form one pair of internally impedance matched transistor circuit units, and this pair of internally impedance matched transistor circuit units outputs the combined outputs from FETs 2a and 2b.

FETs 2c and 2d, input impedance matching circuits 3c and 3d, output impedance matching circuits 4c and 4d, resistors 18c, 18d, 20c, 20d, and capacitors 21d, 32, and 33 form one internal matching transistor. This pair of internally impedance matched transistor circuit units outputs the combined outputs from FETs 2c and 2d.

An isolation resistor is usually inserted between parallel connected FETs to suppress odd mode loop oscillation in a resonance mode. As a result, this exemplary oscillation preventing stabilization circuit 35 both prevents oscillation in the FETs 2a to 2d while functioning as an isolation resistance between adjacent FETs. By designing the capacitance of the capacitors 31 to 33 high enough to short at the loop oscillation frequency, the oscillation preventing stabilization circuit 35 also functions effectively to prevent odd mode loop oscillation in addition to preventing oscillation during low frequency operation.

As described in the first embodiment above, the oscillation preventing stabilization circuit 35 of this second embodiment can alternatively use MOS capacitors for each of the above-noted capacitors. It is also possible to achieve a one chip device by integrating the input impedance matching circuit and the oscillation preventing stabilization circuit on a MOS type substrate, thereby achieving the same benefits noted above in the first embodiment.

An internally impedance matched transistor circuit according to this second embodiment of the present invention thus forms an oscillation preventing stabilization circuit 35 forming a corresponding oscillation preventing stabilization circuit near each FET 2a to 2d and functioning as an isolation resistor between adjacent FETS. The capacitance of capacitors 31 to 33 in the oscillation preventing stabilization circuit 35 is also sufficiently high. In addition to the above-noted benefits achieved by the first embodiment, it is therefore also possible to suppress loop oscillation in the odd resonance mode.

In addition, sharing oscillation preventing circuits between adjacent FETs, the number of capacitors can be reduced, and the number of packaged components can therefore be reduced. By thus reducing the space required inside the package, cost can also be reduced.

Although the present invention has been described in connection with the preferred embodiments with reference to the accompanying drawings, it is to be noted that various changes and modifications will be apparent to those skilled in the art. By way of example, although the present invention has been described above with reference to four internally impedance matched transistor circuit units each outputting the combined output of two FETs in a single package, the present invention shall not be so limited, however, as it will be obvious that as few as one pair of internally impedance matched transistor circuit units can be incorporated into a single package. An internally impedance matched transistor circuit unit outputting the output from one FET can also be formed in a single package.

Accordingly, such changes and modifications are to be understood as included within the scope of the present invention as defined by the appended claims, unless they depart therefrom.

What is claimed is:

1. An internally impedance matched transistor circuit comprising, in a single package:

at least two internally matched transistor circuit units, each transistor circuit unit including:
a semiconductor element for signal processing a high frequency signal;
an input impedance matching unit having an input impedance matching circuit for impedance matching between said semiconductor element and an input terminal to which a high frequency signal is applied from an external source;
an output impedance matching unit having an output impedance matching circuit for impedance matching between said semiconductor element and an output terminal from which is output a high frequency signal processed by said semiconductor element; and
an oscillation preventing stabilization circuit unit having an oscillation preventing stabilization circuit comprising a resistor and a capacitor connected in a series circuit, the resistor being connected to ground through the capacitor and to an input of the semiconductor element, wherein the internally matched transistor circuit units are connected in parallel with the input terminals connected together and the output terminals connected together.

2. The internally impedance matched transistor circuit according to claim 1, including first and second internally impedance matched transistor circuit units and a second resistor connecting the oscillation preventing stabilization circuits of the first and second internally impedance matched transistor circuit units together.

3. The internally impedance matched transistor circuit according to claim 2, wherein the second resistor is connected between the resistors of the oscillation preventing stabilization circuits of the first and second internally impedance matched transistor circuit units.

4. The internally impedance matched transistor circuit according to claim 1, wherein the capacitors of the oscillation preventing stabilization circuits are surface oxidation MOS capacitors.

5. The internally impedance matched transistor circuit according to claim 1, wherein the capacitor and the resistor of each of the oscillation preventing stabilization circuits are commonly located with the respective input impedance matching units on a single MOS substrate.

6. The internally impedance matched transistor circuit according to claim 1, wherein each of the oscillation preventing stabilization circuits includes a second resistor and a second capacitor connected in a second series circuit, the second resistor being connected to ground through the second capacitor and the second resistor being connected to the input of the semiconductor element of the respective internally matched transistor circuit unit.

* * * * *